United States Patent [19]
Suzuki et al.

[11] Patent Number: 5,522,934
[45] Date of Patent: Jun. 4, 1996

[54] PLASMA PROCESSING APPARATUS USING VERTICAL GAS INLETS ONE ON TOP OF ANOTHER

[75] Inventors: Akira Suzuki; Shuichi Ishizuka, both of Nirasaki; Kohei Kawamura; Jiro Hata, both of Yamanashi, all of Japan

[73] Assignee: Tokyo Electron Limited, Tokyo, Japan

[21] Appl. No.: 428,363

[22] Filed: Apr. 25, 1995

[30]    Foreign Application Priority Data

Apr. 26, 1994  [JP]  Japan .................................. 6-110301
Jun. 27, 1994  [JP]  Japan .................................. 6-167451

[51] Int. Cl.$^6$ ................................................. C23C 16/00
[52] U.S. Cl. ........................... 118/723 AN; 118/723 ME; 118/723 MR; 118/723 MA; 118/723 R; 204/298.07
[58] Field of Search ............... 204/298.07; 118/723 ME, 118/723 MW, 723 MR, 723 MA, 723 AN, 723 R

[56]              References Cited

U.S. PATENT DOCUMENTS

| 301,933 | 5/1983 | Steller . |
| 4,383,177 | 5/1983 | Keller et al. . |
| 4,384,938 | 5/1983 | Desilets et al. . |
| 4,948,458 | 8/1990 | Ogle . |
| 4,992,301 | 2/1991 | Shishiguchi et al. ...................... 437/81 |
| 5,105,761 | 4/1992 | Charlet et al. .................... 118/723 ME |
| 5,217,559 | 6/1993 | Moslehi et al. ................... 118/723 ME |
| 5,269,847 | 12/1993 | Anderson et al. ................... 118/723 R |

FOREIGN PATENT DOCUMENTS

| 0379828 | 8/1990 | European Pat. Off. . |
| 57-113539 | 7/1982 | Japan . |
| 358171 | 9/1991 | Japan . |
| 4362091 | 12/1992 | Japan . |
| 5-178416 | 7/1993 | Japan . |
| 5243155 | 9/1993 | Japan ............................... 204/298.07 |
| 5-317375 | 12/1993 | Japan . |
| 669160 | 3/1994 | Japan . |

*Primary Examiner*—R. Bruce Breneman
*Assistant Examiner*—Ramamohan Rao Paladugu
*Attorney, Agent, or Firm*—Oblon, Spivak, McClelland, Maier & Neustadt

[57]              ABSTRACT

A plasma processing apparatus comprises a susceptor for supporting a target object to be processed having a target surface to be processed in a process vessel, a plurality of process gas supply nozzles for supplying a process gas for the target object into the process vessel, and an RF coil for generating an electromagnetic wave in the process vessel to generate a plasma of the process gas. The supplying nozzles have process gas injection holes formed at a plurality of levels in a direction substantially perpendicular to the target surface of the target object in the process vessel, and the gas injection holes located at an upper level are closer to a center of the target surface than gas injection holes located at a lower level.

14 Claims, 10 Drawing Sheets

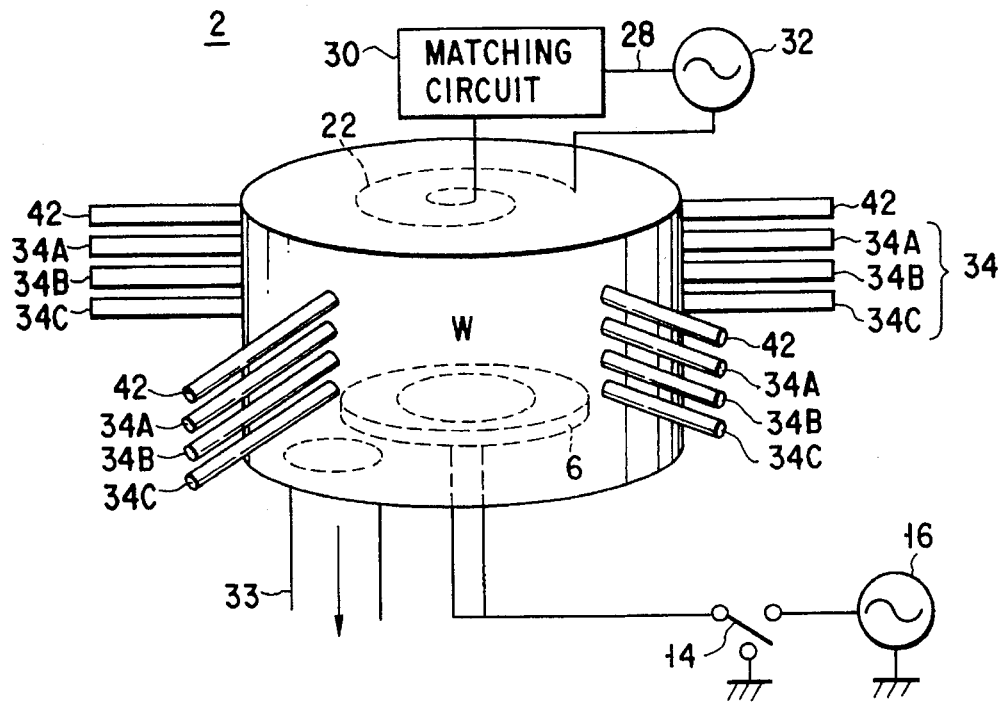
F I G. 1
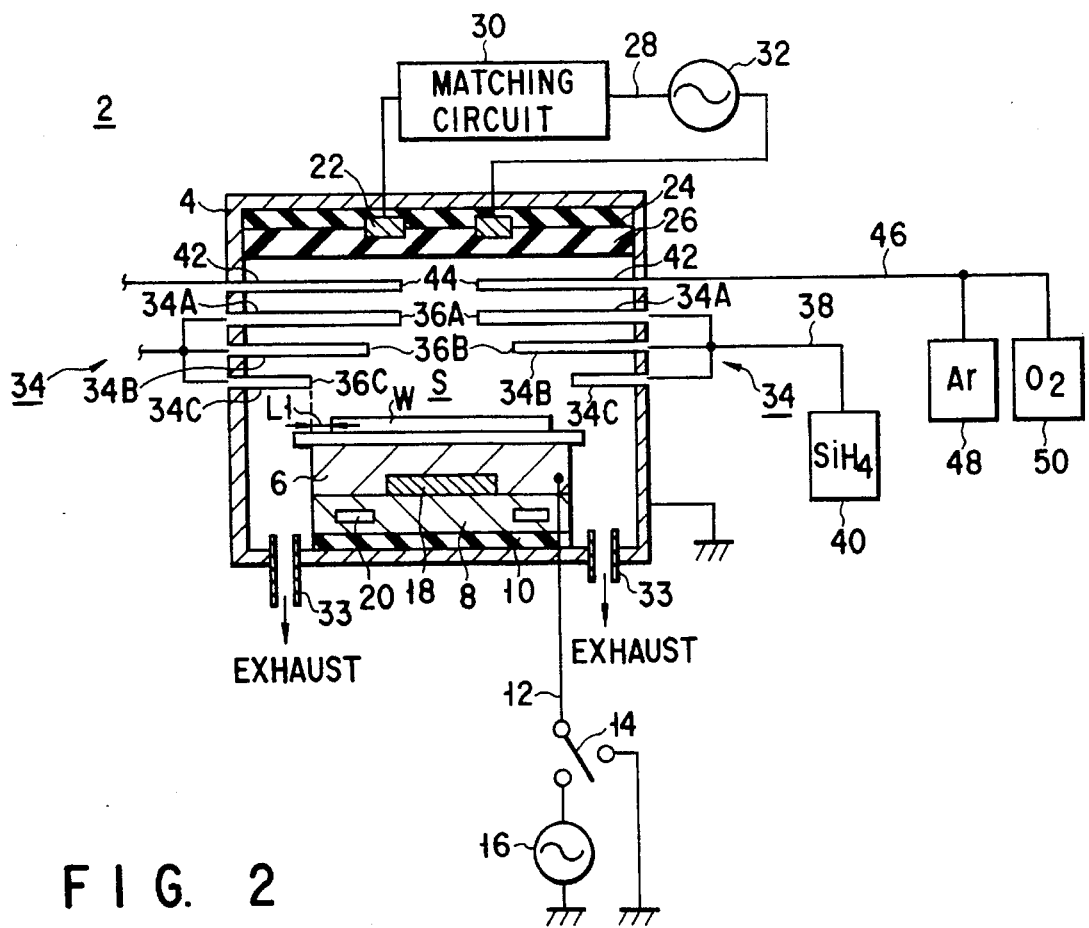
F I G. 2

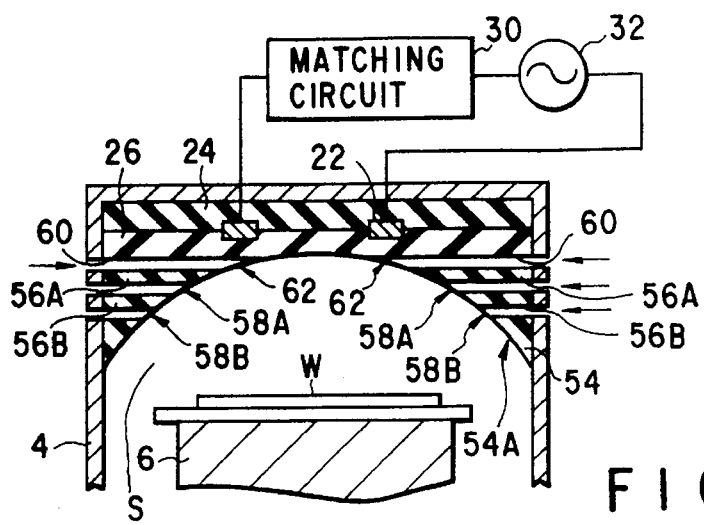
F I G. 8
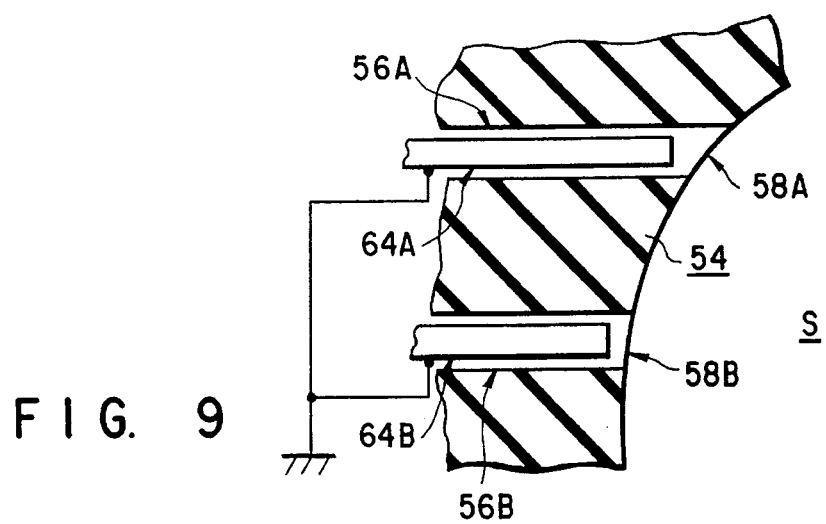
F I G. 9
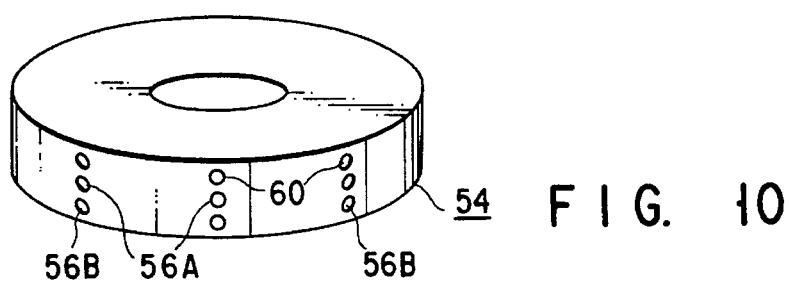
F I G. 10
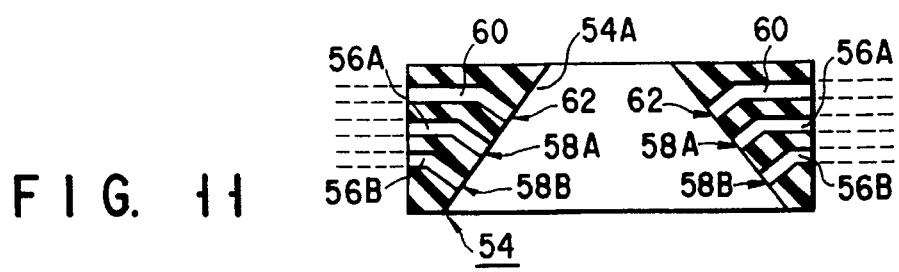
F I G. 11

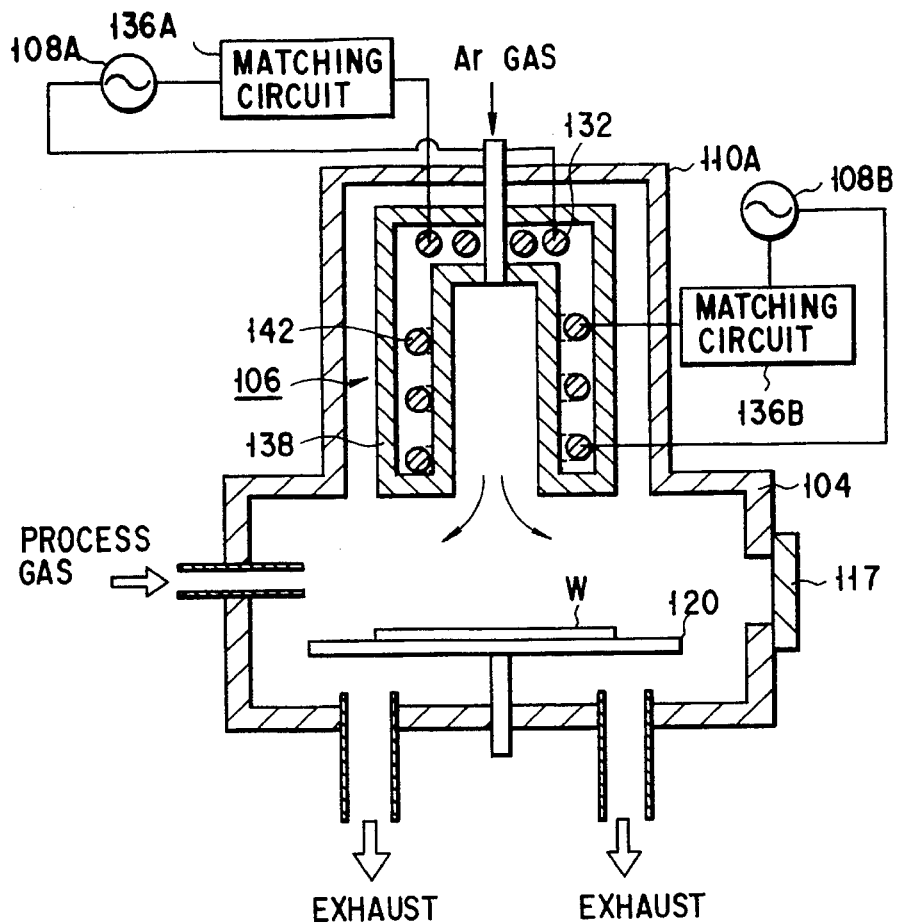
F I G. 19
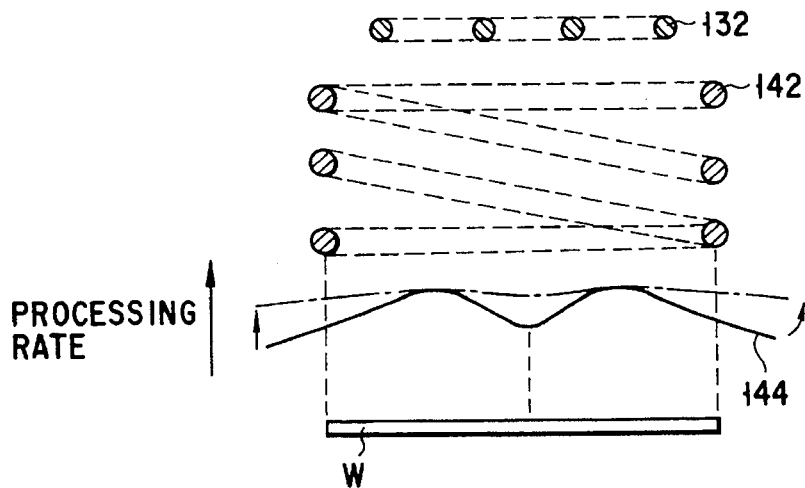
F I G. 20

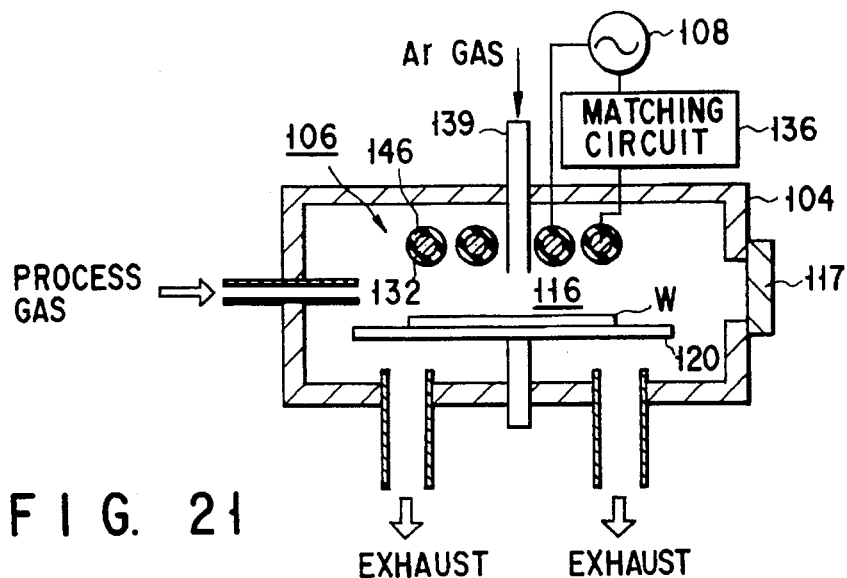
F I G. 21
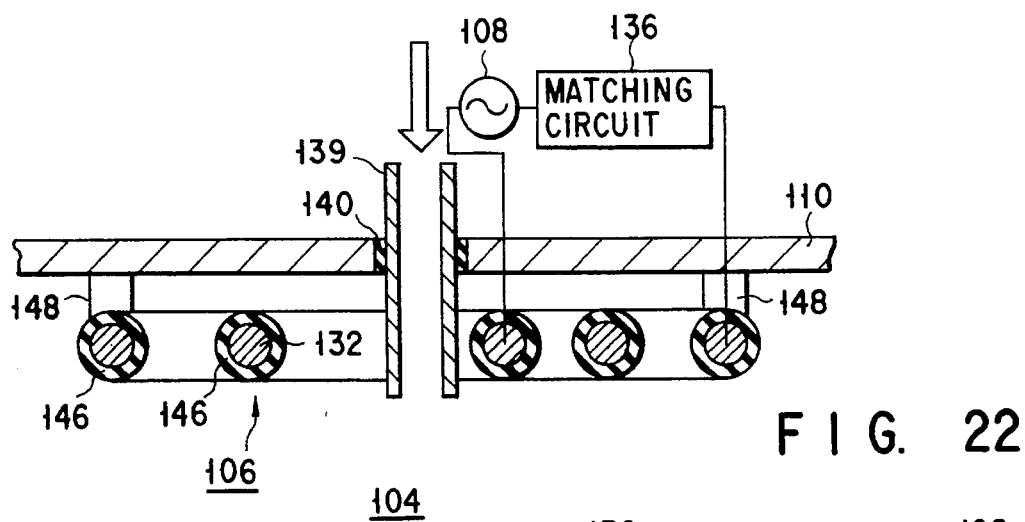
F I G. 22
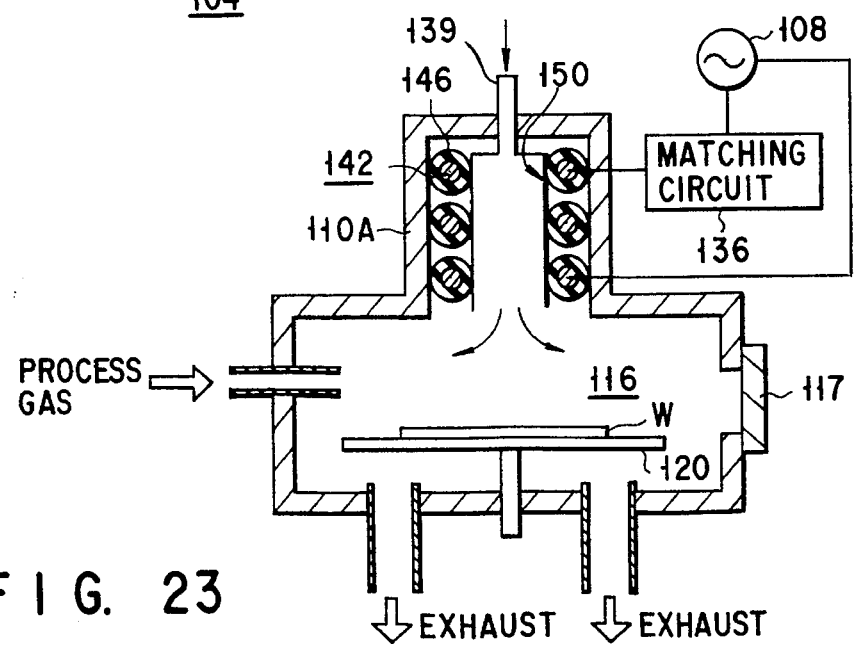
F I G. 23

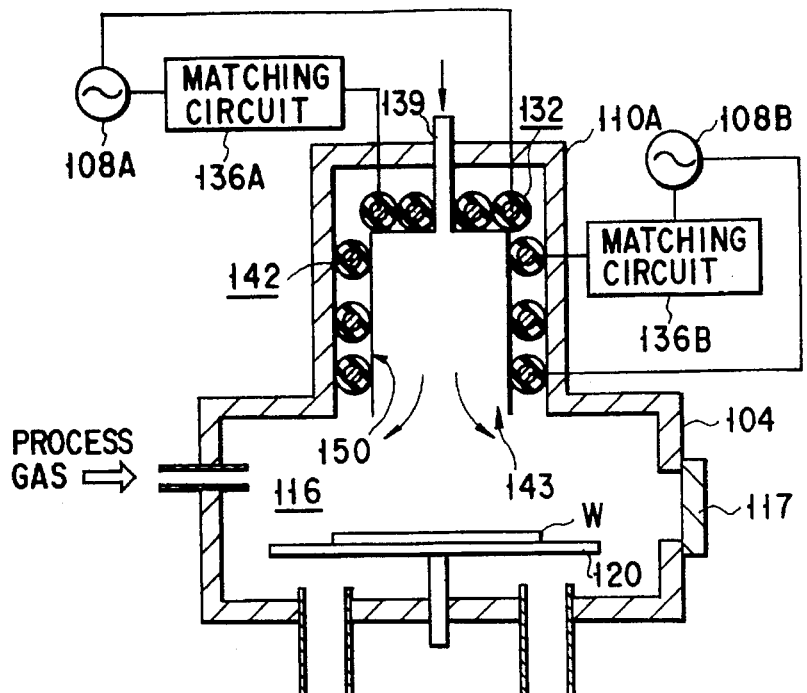
F I G. 24
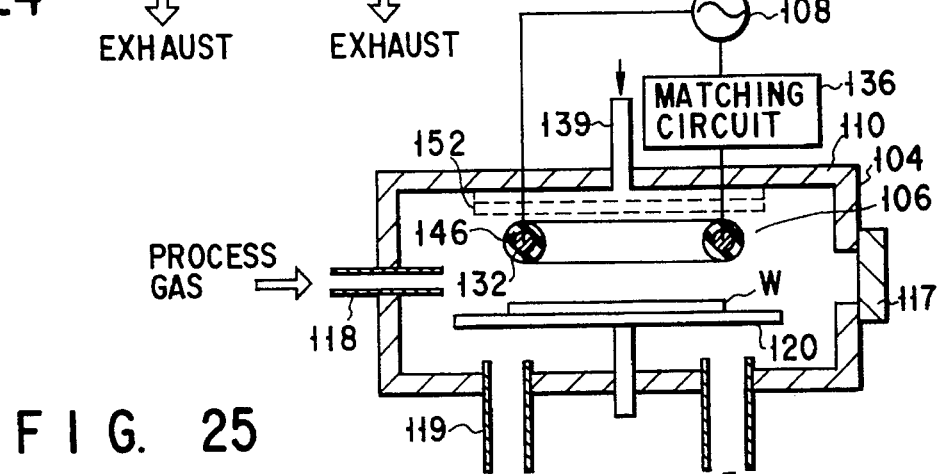
F I G. 25
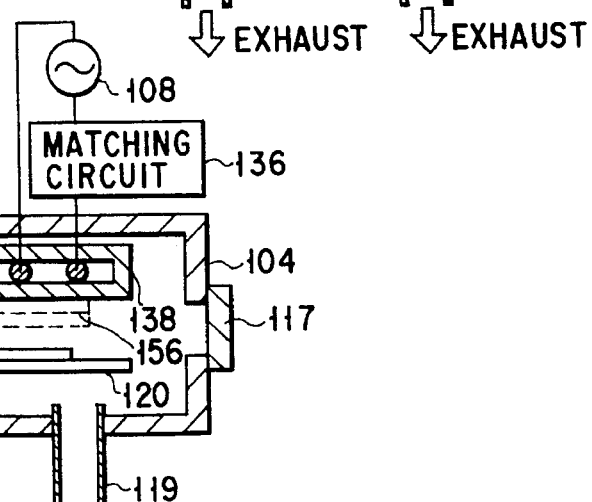
F I G. 26

PLASMA PROCESSING APPARATUS USING VERTICAL GAS INLETS ONE ON TOP OF ANOTHER

BACKGROUND OF THE INVENTION

1. Field of the Invention

The present invention relates to a plasma processing apparatus for supplying a process gas into a process vessel in which an object to be processed is placed to perform plasma processing for the object.

2. Description of the Related Art

In general, in the steps in manufacturing a semiconductor, various processes, e.g., a film forming process, are performed for a semiconductor wafer serving as an object to be processed. As this film forming method, a plasma CVD (Chemical Vapor Deposition) method using both chemical and physical methods is known.

In a plasma processing apparatus for performing this process, for example, two plate-like electrodes are located parallel to each other in a process vessel, and a semiconductor wafer is placed on the lower electrode. An RF voltage of, e.g., 13.56 MHz, is applied from an RF power supply across these electrodes to generate a plasma, thereby performing a film forming process for the surface of the wafer.

The plasma generated between the parallel-plate electrodes as described above becomes an alternating magnetic field having an electric field extending from one electrode to the other electrode. For this reason, electrons and ions are moved by a magnetic force along this electric field, and the charged particles collide with gas molecules while the charged particles are moved. Therefore, a gas which is not easily thermally excited is activated, thereby performing desired film formation.

In order to increase the yield of semiconductor products, it is important to form a film having a uniform thickness in a wafer plane. The thickness of the formed film is considerably influenced by a source or process gas supply method.

The following process gas supply methods are known. First, a supply nozzle is inserted from the circumferential wall of a process vessel into the process vessel, and a source gas is supplied from the supply nozzle toward the upper surface of a wafer. Second, an upper electrode has a plate-like shower head structure, and a process gas is supplied from the upper electrode toward the upper surface of a wafer.

However, when only a process gas is supplied from the circumferential wall of a process chamber as described above, reactive species contributing to film formation do not easily reach the center of the wafer, and thus a film having a uniform thickness cannot be easily formed in a wafer plane.

In addition, even when a plate-like shower head structure is simply used, the flow of a supplied gas may be inadequately disturbed. In this case, the uniformity of a film thickness in a wafer plane cannot be easily assured.

The present inventors proposed, in a preceding application (Japanese Patent Application No. 5-317375), a so-called inductive coupling plasma forming method in which an antenna member is arranged in the upper portion in a process vessel or outside the ceiling portion of the process vessel, and a plasma is induced by an electromagnetic wave from the antenna member.

According to this inductive coupling plasma forming method, a plasma can be generated at a low pressure of $1\times10^{-3}$ Torr or less, and the uniformity of the plasma can be improved. For this reason, the process characteristics of a plasma etching process or a plasma film forming process can be improved. However, when the shower head structure is employed in the inductive coupling plasma processing apparatus, an electromagnetic wave from the antenna member is partially absorbed by the shower head structure consisting of a dielectric, thereby decreasing plasma generation efficiency. For this reason, in the inductive coupling plasma processing apparatus, a process gas or the like must be supplied from the circumferential wall of the process vessel to prevent the plasma generation efficiency from being degraded. Therefore, the in-plane uniformity of a film thickness cannot be sufficiently assured as described above.

In particular, when a semiconductor wafer is increased in diameter, for example, when an 8-inch wafer is used, the uniformity of gas concentrations at the central and edge portions of the wafer poses a problem to be solved.

SUMMARY OF THE INVENTION

It is an object of the present invention to provide a plasma processing apparatus capable of improving the in-plane uniformity of a film thickness even when an object to be processed is increased in diameter.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic perspective view showing a plasma processing apparatus according to a first embodiment of the present invention;

FIG. 2 is a sectional view showing the processing apparatus shown in FIG. 1;

FIG. 8 is a schematic sectional view showing an apparatus according to the second embodiment of the present invention;

FIG. 9 is an enlarged view showing a modification of part of the apparatus shown in FIG. 8;

FIG. 10 is a perspective view showing a gas supply head having a tapered gas injection surface according to the third embodiment;

FIG. 11 is a sectional view showing the gas supply head shown in FIG. 10;

FIG. 19 is a sectional view showing a plasma processing apparatus according to still another embodiment of the present invention;

FIG. 20 is a view showing a change in a processing rate curve when the positional state of an antenna member is changed;

FIG. 21 is a sectional view showing a plasma processing apparatus according to still another embodiment of the present invention;

FIG. 22 is an enlarged sectional view showing an antenna member in the processing apparatus shown in FIG. 21;

FIG. 23 is a sectional view showing a plasma processing apparatus according to still another embodiment of the present invention;

FIG. 24 is a sectional view showing a plasma processing apparatus according to still another embodiment of the present invention;

FIG. 25 is a sectional view showing a plasma processing apparatus according to still another embodiment of the present invention; and FIG. 26 is a sectional view showing a plasma processing apparatus according to still another embodiment of the present invention.

DETAILED DESCRIPTION OF THE PREFERRED EMBODIMENTS

Embodiments of a plasma processing apparatus according to the present invention will be described below with reference to the accompanying drawings.

Figure 3:
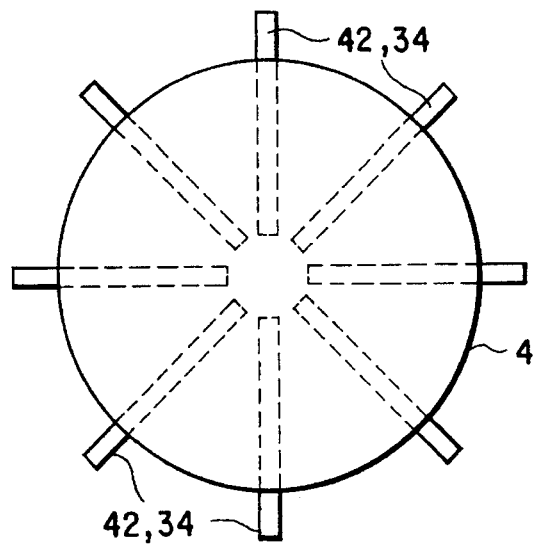
FIG. 3 is a plan view showing the processing apparatus shown in FIG. 1.
Figure 4:
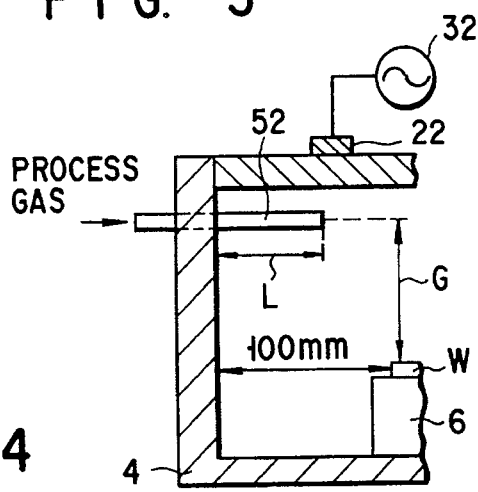
FIG. 4 is a view showing the positional relationship between a nozzle and a wafer to evaluate film formation for a gas supply nozzle position.
Figure 5:
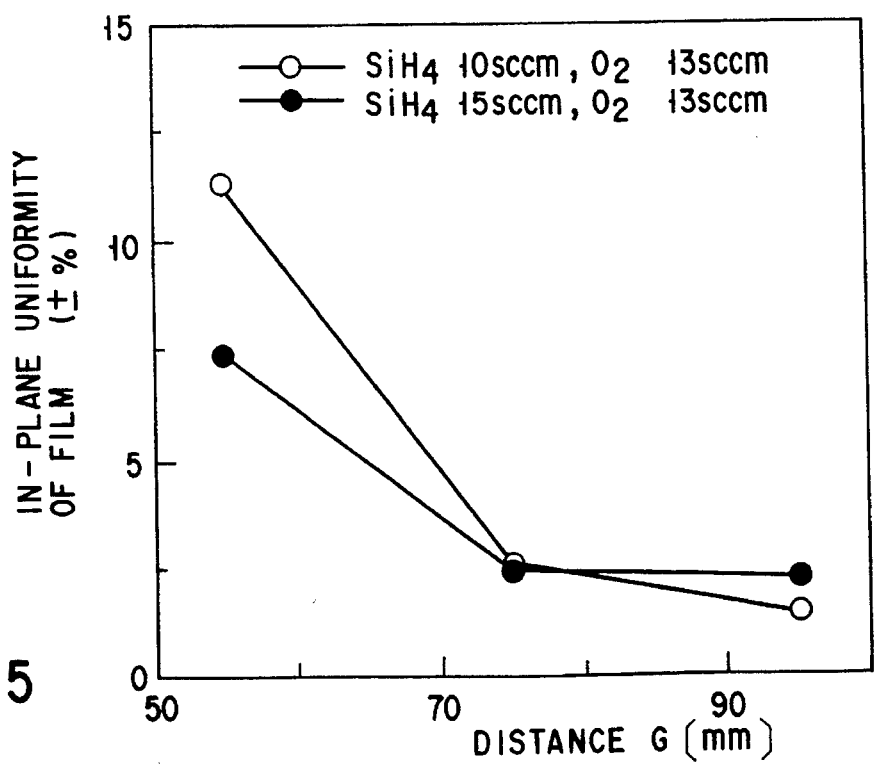
FIG. 5 is a graph showing the in-plane uniformity of a film thickness as a function of the distance between the distal end of the nozzle and the wafer in a direction of height.
Figure 6:
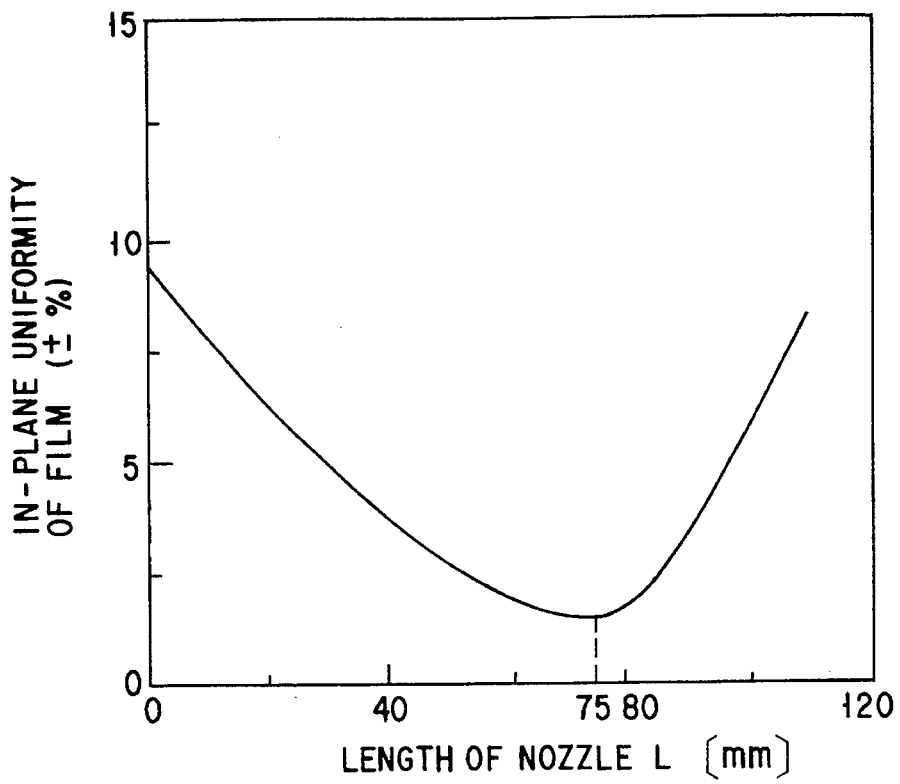
FIG. 6 is a graph showing the in-plane uniformity of a film thickness as a function of the length of the nozzle.

FIG. 1 is a schematic perspective view showing the plasma processing apparatus according to a first embodiment of the present invention, FIG. 2 is a sectional view showing the processing apparatus shown in FIG. 1, FIG. 3 is a plan view showing the processing apparatus shown in FIG. 1, FIG. 4 is a view showing the positional relationship between a nozzle and a wafer to evaluate film formation with respect to a gas supply nozzle position, FIG. 5 is a graph showing the in-plane uniformity of a film thickness as a function of the distance between the distal end of the nozzle and the wafer in a direction of height, FIG. 6 is a graph showing the in-plane uniformity of the film thickness as a function of the length of the nozzle, and FIG. 7 is a view for explaining a result obtained by the graph shown in FIG. 6.

In this embodiment, a case wherein the plasma processing apparatus according to the present invention is applied to a plasma CVD apparatus.

A process vessel 4 (including its flat ceiling and bottom portions) of a plasma CVD apparatus 2 consists of a conductive material such as aluminum or stainless steel, and has a cylindrical shape. The process vessel 4 is grounded. An upper electrode and an object to be processed or a wafer mounting table or a susceptor 6 are concentrically arranged inside the process vessel 4. This susceptor 6 is arranged to support the wafer whose surface to be processed faces upward. However, the wafer may be supported such that the surface to be processed faces in another direction, e.g., sideward or downward.

The susceptor 6 consists of, e.g., anodized aluminum or the like, and has an almost circularly cylindrical shape. The upper portion of the susceptor 6 projects sideward and has a flat upper surface or an upper surface having a curvature to be slightly curved downward toward the edge of the upper surface, thereby forming a disk-like wafer support plate (not shown). The lower portion of the susceptor 6 is supported by a susceptor support table 8 consisting of aluminum like the susceptor 6 and having a circularly cylindrical shape. The susceptor support table 8 is arranged on the bottom portion of the process vessel 4 through an insulator 10. In this manner, the susceptor 6 electrically insulated from the process vessel 4 is supported in the process vessel 4.

The susceptor 6 can be selectively connected to an RF power supply 16 and the ground outside the process vessel through a switch 14 by a power supply path 12 extending from the bottom wall of the process vessel and insulated therefrom.

The wafer support plate of the susceptor 6 is designed such that a semiconductor wafer W serving as an object to be processed is placed on the wafer support table and held by an electrostatic chuck mechanism or the like.

Between the susceptor 6 and the susceptor support table 8, for example, a ceramic heater 18 for heating the wafer supported on the susceptor 6 and for controlling the temperature of the wafer is arranged. A cooling jacket 20 for flowing, e.g., cooling water is formed in the susceptor support table 8 to cool the heated wafer. This ceramic heater 18 is connected to a power supply (not shown) and a temperature controller (not shown) arranged outside the process vessel and heated at a predetermined temperature by the power supply and the temperature controller. The cooling jacket 20 is connected to a cooling water source and a cooler arranged outside the process vessel, and circulates cooling water having a predetermined temperature.

An antenna member 22 consisting of metal, e.g., copper and wound to have a 1- or 2-turn spiral shape is arranged in the upper portion in the process vessel 14 concentrically with the process vessel 4 and the susceptor 6. This antenna member 22 is sandwiched by upper and lower insulating plates 24 and 26 consisting of, e.g., quartz to insulate the antenna member 22 from the ceiling portion of the vessel and to prevent the antenna member 22 from being contaminated by a heavy metal generated by plasma sputtering. The antenna member 22 is attached and fixed to the ceiling portion by the members 24 and 26. A matching box or matching circuit 30 and an RF power supply 32 for generating an electromagnetic wave are connected across the ends of the antenna member 22 through a power supply line 28 extending from the ceiling portion and insulated therefrom. As a result, when the RF power supply 32 causes an RF current to flow in the antenna member 22, an electromagnetic wave can be radiated toward a process space S in the process vessel 4.

A plurality of discharge ports 33 connected to a vacuum pump (not shown) are formed in the bottom portion of the process vessel 4. These discharge ports, for example, four discharge ports, are formed at predetermined intervals along the circumferential direction of the bottom portion. A gate valve (not shown) which can be opened or closed and used to load/unload the wafer W in/from the process vessel 4 is arranged on a portion of the circumferential wall of the process vessel 4.

Eight source gas supply nozzle assemblies or means 34 for supplying a source gas, e.g., silane gas, serving as a process gas from the circumferential wall of the process vessel 4 are radially inserted into the process vessel 4 at equal angular intervals from eight directions.

The number of nozzle insertion directions is not limited to eight, and the number of nozzle insertion directions may be 2 or more. The nozzles are arranged at almost equal angles with respect to the circumferential direction of the vessel.

More specifically, the supply nozzle means 34 constitute supply paths for supplying a process gas. Each nozzle means includes three horizontally extending nozzles 34A, 34B, and 34C consisting of an insulator, e.g., quartz, formed to have pipe-like shapes and attached at a plurality of levels, e.g., three levels in FIG. 2, vertically arranged along the circumferential wall, and airtightly arranged by a seal member or the like (not shown). The number of levels of the nozzles is not limited to three, and the nozzles may be arranged at two or four or more levels. The number of levels is determined by process conditions such as a wafer size.

The proximal end portion of each of the nozzles 34A, 34B, and 34C is connected, through a gas supply tube 38, to a process gas source 40 for storing a source gas such as a silane gas as a process gas. The process gas source 40 may be arranged for each nozzle means, or may be commonly arranged for all the nozzle means. As will be described later, the nozzles 34A, 34B, and 34C have different lengths. For this reason, when a process gas is supplied to these nozzles at once, initial injection timings of the process gas injected from the nozzles into the process space S are different from each other. When the difference in timing is disadvantageous, a valve is arranged in each of the branched supply tubes of the gas supply tube 38 which are respectively connected to the nozzles, and the opening/closing timings of the valves can be set in accordance with the lengths of the nozzles.

Of process gas injection holes 36A, 36B, and 36C at the distal ends of the three nozzles 34A, 34B, and 34C of each nozzle means 34, a process gas injection hole or port located at an upper level is closer to the center of the process vessel than a process gas injection hole or port located at a lower level. Therefore, the process gas injection hole 36B of the intermediate supply nozzle 34B located at a level (intermediate level) higher than that of the process gas injection hole 36C of the lowermost supply nozzle 34C is closer to the center of the vessel than the process gas injection hole 36C, and the process gas injection hole 36A of the supply nozzle 34A located at a level (upper level) higher than that of the injection hole 36B is closer to the center of the vessel than the injection hole 36B. That is, the uppermost nozzle 34A is longest, and the lowermost nozzle 34C is shortest.

The gas injection hole 36C of the lowermost supply nozzle 34C is formed to be located between the inner surface of the circumferential wall of the process chamber and the edge of the wafer W supported on the susceptor 6. A horizontal distance L1 between the vertical end face of the process gas hole 36C and the wafer edge is set to be about 25 mm. Therefore, a source gas can be uniformly supplied into the process space above the wafer surface to improve the in-plane uniformity of film formation.

Eight additive gas supply nozzles 42 consisting of quartz like the supply nozzle means 34, arranged in correspondence with the radial nozzles and horizontally extending, are horizontally inserted in the circumferential wall of the process vessel 4 such that the additive gas supply nozzles 42 are located above the uppermost process gas supply nozzles 34A. The proximal end portions of the nozzles 42 are connected, through a gas supply tube 46, to an Ar gas source 48 for storing an additive gas, e.g., an Ar gas, and an oxygen gas source 50. Additive gas injection holes 44 serving as the distal end portions of the nozzles 42 are located above the process gas injection holes 36A, 36B, and 36C. An additive gas such as an Ar or oxygen gas injected from the additive gas injection holes 44 can be uniformly mixed with the source gas injected from the process gas holes 36A, 36B, and 36C at a high efficiency. In this embodiment, although the length of each additive gas supply nozzle 42 is set to be equal to that of each process gas supply nozzle 34A, these lengths may be different from each other.

The process gas injection holes 36A, 36B, 36C are positioned at a plurality of levels as described above, and, of the process gas injection holes 36A, 36B, and 36C, a process gas injection hole located at an upper level is closer to the center of the vessel than a process gas injection hole located at a lower level, thereby improving the in-plane uniformity of film formation. A reason why the in-plane uniformity can be improved will be described below with reference to FIGS. 4 to 7C.

Referring to FIG. 4, a vertical distance G between the upper surface of the wafer W and the central axis of a source gas supply nozzle (denoted by reference numeral 52 different from that of the supply nozzle described above for descriptive convenience) was changed, and a length L of the source gas supply nozzle 52 was changed to change the distance between the distal end face of the nozzle and the wafer edge. In these cases, the in-plane uniformity of film formation was examined. Note that the distance between the inner surface of the circumferential wall of the vessel and the wafer edge was set to be 100 mm, and a wafer size was set to be 5 inches. A nozzle inner-diameter was set to be 3.2 mm, and a silane gas and an oxygen gas were used as source gases.

The in-plane uniformity obtained when film formation was performed while the distance G in the vertical direction of the nozzle was changed was evaluated. At this time, the distance between the distal end of the nozzle and the wafer edge was set to be 25 mm by fixing the length L of the nozzle to 75 mm. At this time, the in-plane uniformity of a film thickness with respect to the distance G was measured. The obtained result is shown in FIG. 5. Referring to FIG. 5, white circles indicate measurement results obtained when a silane gas serving as a source gas and an oxygen gas have flow rates of 10 sccm and 13 sccm, respectively, and black circles indicate measurement results obtained when the flow rate of the silane gas is changed to 15 sccm.

As is apparent from FIG. 5, as the distance G in the vertical direction of the nozzle is increased, the in-plane uniformity is improved. For this reason, it is found that the uniformity of a film thickness is almost constant by setting the distance G to be 75 mm or more. In this case, although the in-plane uniformity is improved, this improvement is not shown in the graph. However, since the deposition rate of the film formation is decreased with an increase in distance G, it is not preferable that the distance G be excessively increased.

In-plane uniformity was evaluated when film formation was performed such that the distance G in the vertical direction of the nozzle was fixed to 75 mm, and the length L of the nozzle was variously changed. The measurement results of the in-plane uniformity of the film thickness at that time are shown in FIGS. 6 and 7A to 7C.

As is apparent from FIG. 6, as the length of the nozzle 52 is increased, i.e., as the injection port of the nozzle is close to the center of the vessel, the in-plane uniformity is improved until the length L of the nozzle reaches 75 mm. When the length L is 75 mm, (when the distance between the distal end of the nozzle and the wafer edge is about 25 mm), the best in-plane uniformity can be obtained. When the length L of the nozzle 52 is further increased, the in-plane uniformity is degraded.

Figure 7A:
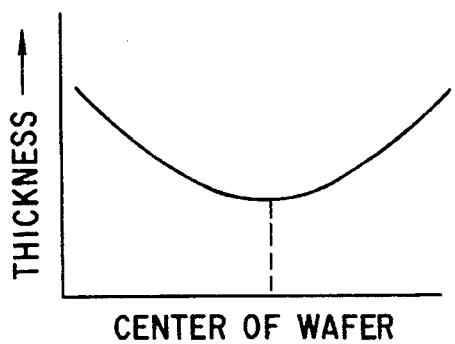
FIGS. 7A to 7C are graphs for explaining the result obtained by the graph shown in FIG. 6.
Figure 7B:
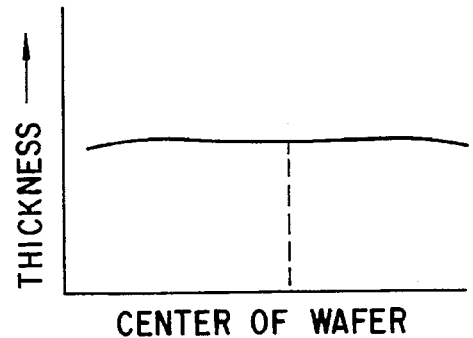
Figure 7C:
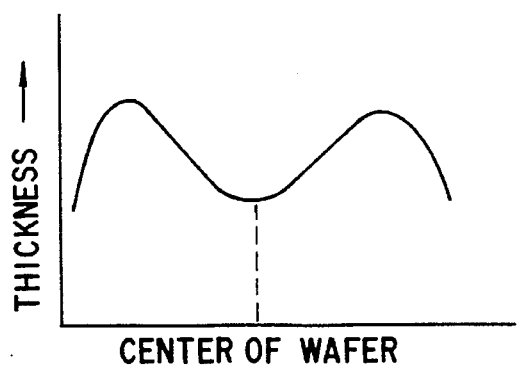

When the film thicknesses of a wafer plane were actually measured at three points where the distance, were set as L=0, L=75, and L=100, the results shown in FIGS. 7A, 7B, and 7C were obtained.

As shown in FIG. 7A, when the distance L=0 mm, the thickness near the center of the wafer is excessively thin. As shown in FIG. 7B, when the distance L=75 mm, the film thickness is almost uniformed along the radial direction of the wafer, and a preferable result is obtained. As shown in FIG. 7C, when the distance L=100 mm, the film thicknesses near the center and edge of the wafer are thin, and the film thickness of the intermediate portion between the center and edge of the wafer is thick.

Therefore, in order to increase the film thickness near the center of the wafer, it is found that the following arrangement is preferably employed. That is, the distal end of the nozzle is inserted into the vessel to almost reach the center of the vessel, i.e., the length L is increased, and the distal end of the nozzle is spaced apart from the wafer surface by a long distance to suppress an influence on the portion except for the central portion, i.e., the distance G is increased. In addition, in order to increase the film thickness of the edge portion of the wafer to some extent, the distal end of the nozzle is preferably located at a position horizontally spaced apart from the wafer edge by a short distance and having a level lower than the level of the nozzle near the center of the vessel.

For this reason, the following fact is clarified. As described above, when process gas injection holes are arranged at a plurality of levels, and an injection hole located at an upper level is closer to the center of the vessel than an injection hole located at a lower level, the in-plane uniformity of film formation can be improved while keeping a high film formation efficiency.

An operation of this embodiment arranged as described above will be described below.

The semiconductor wafer W is loaded into the process vessel 4 by an arm (not shown) through a gate valve (not shown), and the semiconductor wafer W is placed and held on the susceptor 6.

The process vessel 4 is evacuated through the discharge ports 33 to have a vacuum state. A source gas, e.g., a silane gas is supplied from the source gas supply nozzles 34A, 34B, and 34C, and an additive gas obtained by mixing an Ar gas and an oxygen gas is supplied from the additive gas supply nozzles 42 located above the nozzles 34A, 34B, and 34C. The pressure in the process vessel 4 is set to be a process pressure, e.g., a low pressure of about $1\times10^{-3}$ Torr, and, at the same time, the RF power supply 32 for generating a plasma applies an RF wave of, e.g., 13.56 MHz, to the antenna member 22.

At this time, an electromagnetic wave is emitted to the process space S by the induction function of the inductance component of the antenna member 22, and, at the same time, an alternating electric field is generated in the process space S by the function of a capacitive component between the antenna member 22 and the process vessel 4. As a result, the Ar gas is excited in the process space S, thereby generating a plasma. Therefore, a source gas or an oxygen gas which is not easily excited by heat is activated, and reactive species are generated, thereby depositing an $SiO_2$ film on the wafer surface.

In this case, unlike in a conventional parallel-plate electrode apparatus, a plasma is generated at a relatively low pressure falling within the range of $1\times10^{-2}$ Torr to $1\times10^{-6}$ Torr and preferably $1\times10^{-3}$ Torr to $1\times10^{-5}$ Torr. For this reason, reactive species are slightly scattered and have the same directivity during film formation, and a film having a uniform thickness can be formed.

More specifically, according to the present invention, the source gas supply nozzles 34A, 34B, and 34C for supplying a source gas are arranged at a plurality of levels, the length of a nozzle located at an upper level is increased, and the process gas injection hole in the distal end of the nozzle is located on the central side of the process space S. For this reason, a source gas from a process gas injection hole, e.g., the hole 36C, mainly contributes to film formation near the circumferential portion of the wafer, and a source gas from process gas injection holes, e.g., the holes 36B and 36A, mainly contribute to film formation near the intermediate portion between the edge and central portions of the wafer and to film formation near the central portion of the wafer. As a result, film formation can be performed over the wafer plane with a good balance, and the in-plane uniformity of the film thickness can be considerably improved.

In this case, as a process gas injection hole becomes close to the center of the process space S, the process gas injection hole is arranged at a high position further from the wafer surface because the nozzles are arranged at a plurality of levels. For this reason, the source gas from the process gas injection hole, e.g., the hole 36A, located on the central side of the wafer is prevented from excessively contributing to film formation. As a result, as described above, the in-plane uniformity of the film thickness can be considerably improved.

In addition, the additive gas supply nozzles 42 for an Ar or oxygen gas having a larger molecular weight than that of the source gas are located above the source gas supply nozzles 34A, 34B, and 34C. For this reason, the supplied source gas and the additive gas are sufficiently mixed with each other. Therefore, according to this point, the in-plane uniformity of the film thickness can be further improved.

Therefore, even if the wafer is increased in diameter, the present invention can cope with this. For example, the in-plane uniformity of the film thickness of a large-diameter wafer having a diameter of eight or more inches can be improved.

The supply nozzles are radially inserted from the circumferential wall, and the distal ends of the supply nozzles are not easily located below the antenna member 22. For this reason, the supply nozzles do not easily absorb an electromagnetic wave from the antenna member 22, and the power of the electromagnetic wave can effectively contribute to generation of a plasma.

According to the above embodiment, as shown in FIG. 3, a case wherein the nozzles are radially inserted from eight directions is exemplified. However, the present invention is not limited to this embodiment. When nozzles are uniformly arranged along the circumferential direction of the cylindrical process vessel, the number of directions is not limited to three, four, five, six, seven, or the like.

In this embodiment, a case wherein source gas supply nozzles 34A, 34B, and 34C are arranged at three levels is exemplified. However, the number of levels is not limited to three, and the number of levels may be set to be two or four or more.

In addition, in the above embodiment, a gas mixture of an Ar gas and an oxygen gas serving as additive gases is supplied from the additive gas supply nozzles 42 into the vessel. However, the additive gases may be independently supplied from different nozzles without being mixed with each other.

Furthermore, since the antenna member 22 is arranged in the process vessel 4, an emitted electromagnetic wave is reflected by the wall of the vessel and used as a power for producing a plasma. For this reason, energy efficiency can be improved.

In the above embodiment, the supply nozzle means 34 and the additive gas supply nozzles 42 are formed such that pipe-like nozzles consisting of quartz are inserted into the vessel. However, the present invention is not limited to this embodiment, and the following arrangement may be employed. Note that the same reference numerals as in FIG. 2 denote the same parts in FIG. 8, and a description thereof will be omitted.

FIG. 8 shows a CVD apparatus according to the second embodiment, and FIG. 9 is a view showing another source gas supply means.

In the upper portion in a process vessel 4, a gas supply head 54 consisting of quartz glass like the insulating plates 24 and 26 and having a gas injection surface 54A formed on the lower surface of the gas supply head 54 to have a dome-like shape is arranged below an antenna member 22 covered with insulating plates 24 and 26 consisting of quartz glass. That is, the central portion of the gas injection surface 54A is at the highest level, and the level of the gas injection surface 54A is gradually lowered toward the edge of the gas injection surface 54A. In the gas supply head 54, sets of source gas supply paths 56A and 56B vertically arranged at a plurality of levels, two levels in FIG. 8, are horizontally formed, and a plurality of source gas supply means, e.g., eight source gas supply means, are radially arranged. The distal ends of the paths are exposed to a process space S on the gas injection surface 54A as process gas injection holes 58A and 58B. Therefore, in this case, the process gas injection hole 58A of the source gas supply path 56A located at the upper level is closer to the center of the process vessel than the process gas injection hole 58B of the source gas supply path 56B located at the lower level.

As in the embodiment described above, additive gas supply paths 60 for supplying an additive gas are formed above the source gas supply paths 56A located at the upper level. On the gas injection surface 54A, the distal ends of the additive gas supply paths 60 are constituted as additive gas injection holes 62 above the process gas injection holes 58A at the upper level. In this case, the process gas injection holes 58A at the upper level are closer to the center of the process vessel than the process gas injection holes 58B at the lower level. For this reason, the same functional effect as that of the apparatus shown in FIG. 2 can be obtained, and the in-plane uniformity of the thickness of film formation can be improved. In addition, this embodiment can cope with an increase in diameter of a wafer.

In the apparatus shown in FIG. 8, the source gas supply paths 56A and 56B and the additive gas supply paths 60 which are formed in the gas supply head 54 are directly constituted as gas paths. The apparatus is not limited to this arrangement. For example, as shown in an enlarged view of FIG. 9, metal pipes 64A and 64B may be inserted into the gas supply paths 56A and 56B, respectively, and a gas may flow in the metal pipes 64A and 64B. In this case, in order to prevent plasma sputtering to the metal pipes 64A and 64B, the distal ends of the pipes are located at positions slightly withdrawn from the process gas injection holes 58A and 58B in the distal ends of the gas supply paths 56A and 56B not to project from the process gas injection holes 58A and 58B toward the process space S. The metal pipes 64A and 64B are grounded to prevent plasma discharge from occurring in the metal pipes 64A and 64B. Note that, although not shown in FIG. 9, in the additive gas supply paths 60, the same arrangements as that in the source gas supply paths 56A and 56B are constituted, respectively, as a matter of course.

In each of the above embodiments, each gas supply path is almost horizontally formed. However, the gas supply path may be formed such that the gas supply path is bent downward to cause the distal end portion of the gas supply path to face toward the center of the susceptor.

In each of the examples shown in FIGS. 8 and 9, a case wherein the gas injection surface 54A of the gas supply head 54 is formed to have a dome-like shape has been described. The present invention is not limited to these examples. For example, as shown in FIGS. 10 and 11, the gas injection surface 54A may be tapered. FIG. 10 is a perspective view showing a modification of the gas supply head, and FIG. 11 is a sectional view showing the gas supply head shown in FIG. 10.

In this embodiment, a gas injection surface 54A serving as the inner circumferential surface of a gas supply head 54 consisting of quartz glass is tapered to form part of the inclined surface of a shape of pyramid or circular cone but a dome-like shape. In this gas supply head 54, as in the head shown in FIG. 8, source gas supply paths 56A and 56B constituting a plurality of levels, e.g., two levels, and additive gas supply paths 60 are arranged. In particular, in the embodiment, the gas supply paths 56A, 56B, and 60 are obliquely bent downward such that their distal ends face toward the center of a susceptor, and the gas is efficiently injected toward a process space S above the susceptor. According to this point, the in-plane uniformity of the thickness of a film formed on a wafer, i.e., a surface to be processed, can be further improved.

Figure 12:
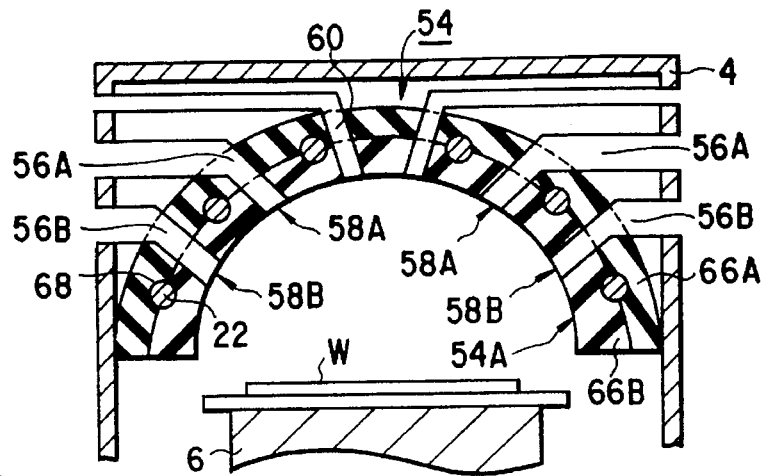
FIG. 12 is a schematic sectional view showing an apparatus, according to the present invention, in which a gas supply head itself is formed to have a dome-like shape.
Figure 13:
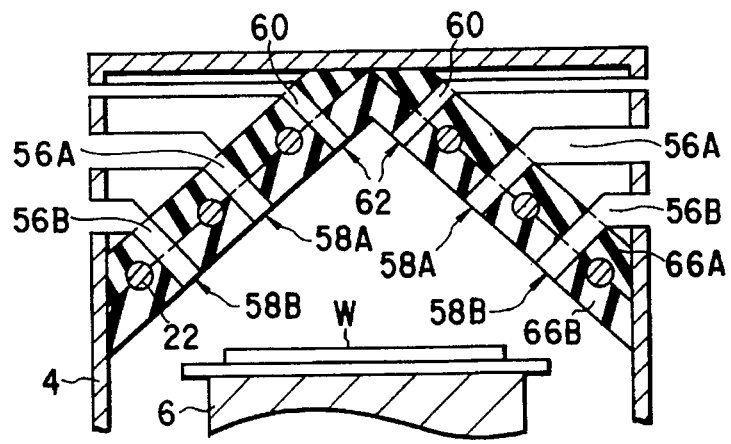
FIG. 13 is a schematic sectional view showing an apparatus, according to the present invention, in which a gas supply head itself is formed to have a tapered shape.

In each of the embodiments described above, the antenna member 22 covered with the insulating plates 24 and 26 is arranged in the upper portion in the process vessel. However, the present invention is not limited to these embodiments, and, as shown in FIGS. 12 and 13, an antenna member may be buried in an insulating member constituting a gas supply head to cover the antenna member with the insulating member. Referring to FIG. 12, a gas supply head 54 consisting of quartz glass is formed to have a dome-like shape having a predetermined thickness, and the head 54 can be vertically separated into an upper head portion 66A and a lower head portion 66B. The lower semispherical surface of the lower head portion 66B is used as a gas injection surface 54A.

A spiral groove 68 capable of storing an antenna member 22 is formed in each of the joint portions of the upper and lower head portions 66A and 66B, and the upper and lower head portions 66A and 66B are joined with each other while the antenna member 22 is stored in the grooves. The resultant head is mounted in the vessel.

In the dome-like gas supply head 54, source gas supply paths 56A and 56B identical to the source gas supply paths 56A and 56B shown in FIG. 8 are formed at a plurality of levels, e.g., two levels, and additive gas supply paths 60 are formed above the source gas supply paths 56A and 56B. Therefore, a process gas injection hole 58A in the distal end of the upper source gas supply path 56A is closer to the center of the process vessel than a process gas injection hole 58B in the distal end of the lower source gas supply path 56B.

In this case, the same functional effect as that in FIG. 2 can be obtained. In addition, since the antenna member 22 is incorporated in the gas supply head 54, the upper and lower insulating plates 24 and 26 required in the embodiment shown in FIG. 8 can be made unnecessary, and the structure of the apparatus can be simplified.

Referring to FIG. 13, a tapered gas supply head 54 having a predetermined thickness is arranged in place of the dome-like gas supply head 54 having the predetermined thickness and shown in FIG. 12. In this case, the tapered gas supply head 54 having the predetermined thickness can be vertically separated into an upper head portion 66A and a lower head portion 66B, and an antenna member 22 is interposed between the joint portions of the upper and lower head portions 66A and 66B. In addition, as in the embodiment shown in FIG. 12, source gas supply paths 56A and 56B are formed at a plurality of levels in the gas supply head 54, and additive gas supply paths 60 are formed at a level higher than that of the source gas supply paths 56A and 56B.

In a conventional shower head structure, a film adheres to a step portion is formed near a gas injection port to generate particles. However, when the gas injection surface has the dome-like or tapered shape as described above, no step portion is formed near the gas injection port, and film formation near the gas injection port can be prevented. Therefore, each of the above embodiments can contribute to a decrease in the number of particles.

In each of the above embodiments, the gas injection surface is formed to have a dome-like shape or a tapered shape, and a process gas injection hole at an upper level is closer to the center of the process vessel than a process gas injection hole at a lower level. When the above positional relationship between the injection holes is satisfied, the shape of the gas injection surface is not limited to the shapes described above. For example, the gas injection surface may have a step-like shape.

Figure 14:
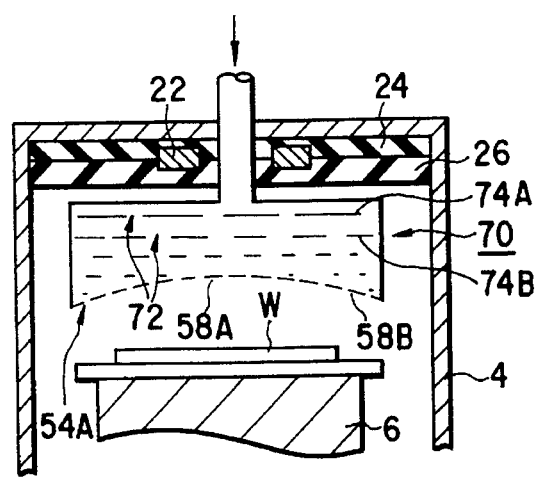
FIG. 14 is a schematic sectional view showing an apparatus, according to the present invention, in which the gas injection surface of a gas supply head suspended from a ceiling portion is formed to have a dome-like shape.

In each of the above arrangements, a case wherein the source gas supply paths and the additive gas supply paths are inserted or provided from the circumferential wall of the process vessel has been exemplified. However, the present invention is not limited to these embodiments. For example, the following shower head structure may be formed. That is, as shown in FIG. 14, an antenna member 22 sandwiched by upper and lower insulating plates 24 and 26 may be arranged on the ceiling portion in a process vessel 4, a gas supply head 70 consisting of, e.g., quartz glass, for supplying a source gas and an additive gas may be supported to be suspended from the ceiling portion. In this case, a conventional shower head structure has a lower gas injection surface which opposes a lower electrode and is formed to have a planar-plate shape. However, in this embodiment, a gas injection surface 54A is formed to have a dome-like shape as in the structure shown in FIG. 8 or 12, and a plurality of process gas injection holes 58A and 58B are formed in the gas injection surface 54A. Therefore, in this case, of the plurality of process gas injection holes, the process gas injection hole 58A located at the upper level is closer to the center of the process vessel than the injection hole 58B located at the lower level. For this reason, the same functional effect as that shown in FIG. 8 or 12 can be obtained. In this case, when one or two diffusion plates 74A and 74B each having a large number of diffusion holes 72 are arranged in the gas supply head 70, an amount of gas supplied to the process space S can be uniformed. When a plurality of diffusion plates are arranged, the diffusion plates are preferably designed such that the diffusion holes 72 of one diffusion plate are shifted from the diffusion holes 72 of the other diffusion plate, respectively, as shown in FIG. 14.

In each of the above embodiments, a case wherein the antenna member 22 is stored in the vessel has been described. However, the antenna member 22 may be shielded and located outside the vessel, e.g., on the upper surface side of the ceiling portion.

In each of the above embodiments, a case wherein a silane gas ($SiH_4$) is used as a source gas, and an Ar gas and an oxygen gas are used as additive gases has been described. However, the source and additive gases are not limited to these gases, as a matter of course.

As described above, according to the plasma processing apparatus of the present invention, the following excellent functional effects can be obtained.

The process gas injection holes are formed at a plurality of levels in the process vessel, and a process gas injection hole located at an upper level is closer to the center of the process vessel than a process gas injection hole located at a lower level. For this reason, a plasma concentration or the concentration of reactive species above an object to be processed can be uniformed. Therefore, the in-plane uniformity of the thickness of a film formed on the surface of the object can be improved.

Therefore, even if the diameter of the object is increased, the apparatus can cope with this such that process gas injection holes are formed at a plurality of levels. The in-plane uniformity of the thickness of film formation can be kept high.

when the process gas injection holes are formed at a plurality of levels in the gas supply head having a gas injection surface having a dome-like shape or a tapered shape, as in the above description, a process gas injection hole is closer to the center of the process vessel than a process gas injection hole at a lower level. As a result, as described above, the in-plane uniformity of a film thickness can be improved.

when the additive gas injection holes are formed at a level higher than that of the process gas injection holes, a process gas (source gas) supplied into the process vessel and an additive gas can be uniformly mixed with each other. Therefore, the in-plane uniformity of a film thickness can be further improved.

A plasma processing apparatus according to still another embodiment of the present invention will be described below with reference to the accompanying drawings.

Figure 15:
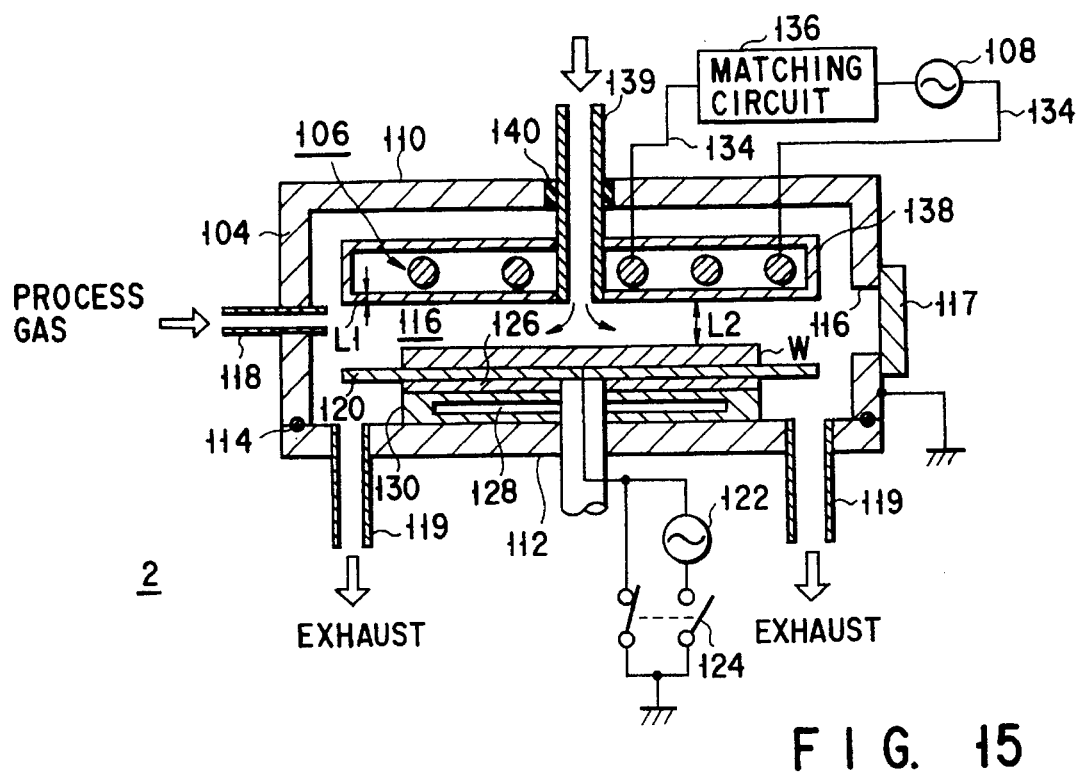
FIG. 15 is a sectional view showing a plasma processing apparatus according to still another embodiment of the present invention.
Figure 16:
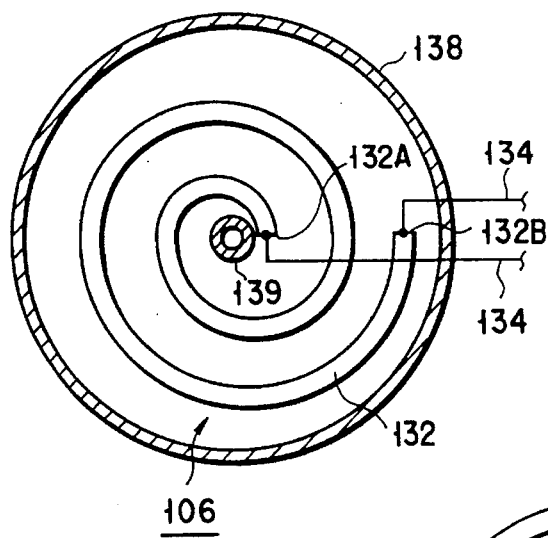
FIG. 16 is a plan view showing an antenna member in the apparatus shown in FIG. 15.

FIG. 15 is a sectional view showing a plasma processing apparatus according to the present invention, and FIG. 16 is a plan view showing an antenna member in the apparatus shown in FIG. 15.

In this embodiment, a case wherein the plasma processing apparatus according to the present invention is applied to a plasma etching apparatus.

In a plasma etching apparatus 102, an antenna member 106 is arranged inside a ceiling portion in a process vessel 104, and an RF power supply 108 for generating a plasma is connected to both the ends of the antenna member 106. The process vessel 104 consists of a conductive material such as aluminum or stainless steel and formed to have a circularly cylindrical shape, and a ceiling portion 110 and a bottom portion 112 also consist of a conductive material such as aluminum or stainless steel. This bottom portion 112 is airtightly attached to the lower-end opening portion of the process vessel 104 through a seal member 114 to airtightly close the interior of the process vessel 104. Therefore, an airtightly closed process chamber 116 is formed in the process vessel 104.

When the circumferential wall of the process vessel 104, the ceiling portion 110, and the bottom portion 112 consist of aluminum, anodization is performed to form a corrosion-resistant coating on the inner surface of the process vessel 104. This process vessel 104 is electrically grounded.

A loading/unloading port 116 for loading/unloading, e.g., a semiconductor wafer serving as an object to be processed in/from the process vessel 104 is formed in the circumferential wall of the process vessel 104, and a gate valve 117 which can be airtightly opened or closed is arranged in the loading/unloading port 116. A process gas supply tube 118 for supplying a process gas, e.g., an HF gas or the like, from a process gas source (not shown) into the process chamber 116 through a mass-flow controller (not shown) is arranged in the circumferential wall of the process vessel opposing the gate valve 117. Therefore, this process gas supply tube 118 preferably consists of quartz or a semiconductor such as silicon not to absorb an RF power. Although the process gas supply tube 118 is shown as a single member in FIG. 15 for descriptive convenience, the process gas supply tube 118 is constituted by a plurality of source gas nozzles arranged with the predetermined relationship described as the source gas supply nozzle assembly 14 in FIGS. 1 and 2. A plurality of gas discharge pipes 119 arranged at predetermined intervals along the circumferential direction of the bottom portion 112 are connected to the bottom portion 112 of the process vessel 104, and the process vessel 104 can be evacuated by a vacuum pump (not shown).

A disk-like susceptor 120 for placing a semiconductor wafer W serving as an object to be processed is arranged in the process vessel 104. A wafer holding member such as an electrostatic chuck (not shown) is arranged on the placing surface to reliably attract and hold the wafer by, e.g., a Coulomb force.

The susceptor 120 is connected, through an insulated wiring, to a parallel circuit constituted by an RF power supply 122 and a two-throw switch 124 whose ON and OFF states are reversed to each other, so that it can select whether the susceptor 120 is grounded or applied with an RF power.

A temperature adjusting unit, e.g., a ceramic heater 126, for adjusting the temperature of the semiconductor wafer W is arranged below the susceptor 120. A cooling jacket 130 capable of circulating a coolant 128 such as liquid nitrogen is arranged below the ceramic heater 126. When the cooling jacket 130 and the ceramic heater 126 are combined to each other, a wafer temperature can be set to be an arbitrary temperature falling within the range of a low temperature near the temperature of the liquid nitrogen to a high temperature.

The antenna member 106 arranged to oppose the susceptor 120 at a predetermined interval is constituted by an antenna portion 132, obtained such that a material having a circular section and consisting a conductive material such as gold or copper is spirally wound by, e.g., two turns in a plane shown in FIG. 16. An inner circumferential end 132A and outer circumferential end 132B of the antenna portion 132 are connected, through wiring lines 134, to the RF power supply 108 for generating a plasma and a matching box 136 for controlling a capacitance for stably generating a plasma. Therefore, when a radio wave is emitted from the antenna member 106 toward the process chamber 116 therebelow, and an electric field is generated between the antenna member 106 and the circumferential wall of the process vessel or the susceptor 120, a plasma can be generated in the process chamber 116 by a so-called inductive coupling method.

Figure 17:
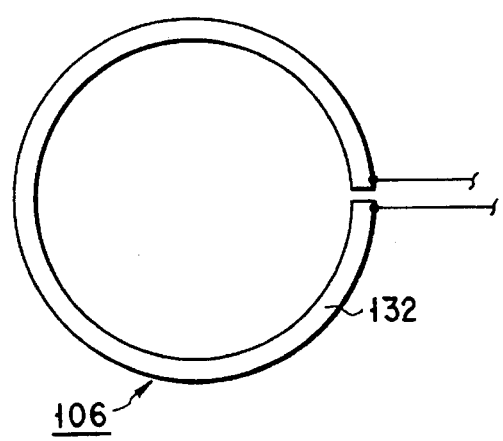
FIG. 17 is a plan view showing a 1-turn antenna member.

In this case, the sectional shape of the antenna member 106 is not limited to a circle, and the antenna member 106 can be formed by winding a band-like material having a rectangular section. In addition, the number of turns of the antenna member 106 is not limited to two, and, as shown in FIG. 17, a material which is spirally wound by one turn or three or more turns may be used as the material of the antenna member 106. In any case, the diameter of the antenna member 106 is set to be equal to or larger than the diameter of the wafer, and the uniformity of a plasma density can be assured over the entire surface of the wafer. Furthermore, the frequency of the RF power supply 108 for generating a plasma is set within the range of 1 to 200 MHz and preferably set to be 2 MHz, 13.56 MHz, or about 56 MHz.

The antenna member 106 arranged in the process vessel 104 entirely consists of a dielectric or insulator such as quartz or a ceramic, and the antenna member 106 is arranged in an antenna protecting cover or box 138 which is airtightly kept from the process chamber 116. More specifically, the antenna protecting cover 138 is constituted as a disk-like vessel which is large enough to store the overall antenna member 106. An inert gas supply tube 139 for supplying an inert gas such as an argon gas vertically extends through the central portion of the antenna protecting cover 138, and the antenna protecting cover 138 is attached to the lower portion of the inert gas supply tube 139. The inert gas supply tube 139, therefore, preferably consists of a semiconductor such as quartz or silicon to prevent the inert gas supply tube 139 from absorbing an RF power.

The upper portion of the inert gas supply tube 139 is arranged to be airtightly inserted, through, e.g., an insulating seal member 140, into a through hole formed in the center of the ceiling portion 110 of the process vessel 104. This inert gas supply tube 139 is connected to an inert gas source through a mass-flow controller (not shown) or the like. Therefore, the antenna protecting cover 138 is supported by the process vessel 104 through the inert gas supply tube 139, and the antenna protecting cover 138 is kept to oppose the wafer W at a predetermined interval in the process vessel. The attaching state of the antenna protecting cover 138 is not limited to the above arrangement, as a matter of course. For example, the antenna protecting cover 138 can be attached to the process vessel 104 directly or through a known attaching member.

A thickness L1 of the plate constituting the antenna protecting cover 138 is a thickness, e.g., about several mm, at which a heavy metal obtained by causing a plasma to sputter the antenna member 106 is prevented from scattering into the process chamber 116, and a radio wave emitted from the antenna member 106 can propagate into the process chamber 116 without changing the form of the radio wave.

The inner diameter of the process vessel 104 is set to be about 50 cm when an object to be processed is an 8-inch wafer. At this time, an interval L2 between the susceptor surface and the lower surface of the antenna protecting cover 138 is set within the range of 30 to 150 mm.

As described above, the antenna member 106 is stored in the process vessel 104, and the interval between the antenna member 106 and the susceptor 120 is decreased. For this reason, a plasma can be efficiently generated by a low power.

In this case, it can be considered that the antenna member 106 is arranged outside the process vessel 104, e.g., on the upper surface side of the ceiling portion 110. However, this arrangement is not preferable for the following point. That is, when the antenna member 106 is arranged on the outer surface of the ceiling portion 110 in the atmospheric air, heavy metal contamination to be caused by the material constituting the antenna member during plasma processing can be prevented. However, the material of the ceiling portion must be changed from a conductive material such as aluminum or stainless steel to a dielectric such as a quartz plate to efficiently propagate a radio wave generated by the antenna member 106 into the process chamber 116.

In this case, not only the thickness of the quartz plate must be set to be several cm to withstand the difference between the pressure outside the process chamber 116 and the pressure in the process chamber 116, but also the diameter of the quartz plate must be set to be about 50 cm, depending on a wafer size, when a process vessel for a 12-inch wafer is used. Therefore, the quartz plate becomes very expensive.

Furthermore, when the pressure-resistant quartz plate is used as described above, the outer surface of the quartz plate is in contact with the atmospheric air kept at room temperature, and the inner surface of the quartz plate is in contact with an atmosphere in the process chamber having a relatively high temperature. For this reason, the quartz plate may be broken due to the difference between the temperatures of the upper and lower surfaces of the quartz plate. In particular, when a harmful process gas such as an $SiH_4$ gas is used, this gas may leak into the atmospheric air.

When the antenna member is arranged outside the process vessel, not only the distance between the antenna member and the wafer becomes considerably long, but also an RF power is supplied through the quartz plate. For this reason, the applied RF power is insufficient, and an energy loss is increased, so that an RF power may not be efficiently applied.

Since the antenna member is arranged outside the process vessel, the antenna member must be shielded to prevent an electromagnetic wave from leaking outside the apparatus. For this reason, the structure of the apparatus itself is complicated.

In addition, since the antenna member is arranged outside the ceiling portion, a process gas for plasma processing or an inert gas must be supplied from the circumferential wall portion into the process chamber, and the in-plane uniformity of a wafer in an etching process or a CVD process may not be satisfactorily assured.

The operation of the apparatus of this embodiment arranged as described above will be described below.

The wafer W is conveyed into the process chamber 116 by a convey arm (not shown) through the gate valve 117, and the wafer W is placed on the placing surface of the susceptor 120 and attracted and held by the Coulomb force of the electrostatic chuck.

The process chamber 116 is evacuated by a vacuum pump (not shown) connected to the gas discharge pipe 119, and a process gas such as an HF gas and an inert gas such as an Ar gas are respectively supplied, into the process chamber 116, from the process gas supply tube 118 arranged in the circumferential wall and the inert gas supply tube 139 arranged to airtightly extend through the central portion of the ceiling portion 110. The pressure in the process chamber 116 is kept considerably low, e.g., about $1 \times 10^{-3}$ Torr. At the same time, an RF wave having a frequency of 13.56 MHz is applied to both the ends of the antenna member 106 by the RF power supply 108 for generating a plasma.

As a result, a radio wave is emitted from the antenna member 106 toward the entire lower surface of the process chamber by the induction function of the inductance component of the antenna member 106. At the same time, when an RF power is applied from the RF power supply 122 to the susceptor 120, an alternating electric field is generated by the function of a capacitive component between the antenna member 106 and the susceptor 120. As a result, the process gas and the Ar gas are activated and ionized to generate a plasma. Active species generated by plasma discharge excitation etch the wafer surface with a high anisotropy. Note that, in this case, the RF power may be applied to the susceptor 120 as described above, or may be grounded.

Anions in the active species are moved to the susceptor 120 by the functions of the radio wave and the electric field while being spirally turned. The distance by which the anions can be moved is longer than that in a conventional apparatus using a parallel-plate electrode. For this reason, the anions collide with gas molecules while the anions are moved to generate a large number of ions. Therefore, the generation efficiency of a plasma is improved, and an etching rate can be increased.

In addition, since this plasma is generated at a considerably low pressure falling within the range of $1 \times 10^{-3}$ Torr to $1 \times 10^{-6}$ Torr, the active species are slightly scattered, and their directivity is the same during etching. Therefore, an etching process can be performed with a high anisotropy to obtain a sharp shape. For example, micropatterning required in a 64- or 256-Mbit DRAM can be performed.

In particular, the antenna member 106 is stored in the process vessel 104 in this embodiment. For this reason, the distance L2 between the antenna member 106 and the wafer W decreases, and a radio wave emitted from the antenna member 106 is directly irradiated on the gas in the process chamber 116 while being rarely attenuated and excites the gas. Therefore, the generation efficiency of the plasma can be considerably increased, and the high density of the plasma can be achieved. In this case, since antenna member 106 is entirely covered with the antenna protecting cover 138, the antenna member 106 is not sputtered by the active species, and the wafer is not contaminated with a heavy metal.

When the antenna member 106 is stored in the process vessel 104, the ceiling portion 110 of the process vessel 104 is vacant. For this reason, a gas supply tube such as the inert gas supply tube 139 can be arranged in the ceiling portion 110, and a gas can be directly supplied to the central portion in the process chamber 116. Therefore, the gas can be uniformly dispersed over the entire area of the wafer surface in the process chamber 116 to uniformly generate a plasma, and in-plane uniformity can be improved.

This embodiment is compared with a case wherein the antenna member 106 is arranged outside the process vessel 104 and the ceiling portion 110 consists of disk-like quartz having a large thickness. In this case, according to the embodiment, a quartz plate is not used as the ceiling portion, and the ceiling portion can consist of aluminum or the like and can be integrated with the circumferential wall. For this reason, the cost can be considerably reduced, and the problems of the breakdown of the ceiling portion and leakage of a harmful gas caused by using the quartz plate can be solved. In addition, since a radio wave generated by the antenna member 106 is shielded by the process vessel 104 consisting of a conductive material, special shielding need not be independently performed.

In the above embodiment, a case wherein the planar antenna portion 132 obtained by planarly, spirally winding a conductor is used as the antenna member 106 has been described. In place of the antenna portion 132, a cylindrical coil portion 142 shown in FIG. 18 may be used. Although a ceramic heater, a cooling jacket, and the like are not illustrated in the drawings of the embodiments to be described below, these parts may not be arranged, as a matter of course. In this embodiment, a thick wire consisting of a conductive material such as copper is spirally wound a plurality of times, three times in FIG. 18 to constitute the cylindrical coil portion 142. In this case, the inner diameter of the coil portion 142 is preferably set to be equal to or larger than the diameter of the wafer W to uniformly generate a plasma in a wafer plane.

The cylindrical antenna member 106 is stored in an antenna storing projection portion 110A obtained by causing the central portion of the ceiling portion 110 of the process vessel 104 to extend upward in the form of a cylindrical shape, and the coil portion 142 is arranged such that the central axis of the coil portion 142 is perpendicular to the surface of the wafer W.

The overall coil portion 142 is covered with the antenna protecting cover 138 having a double cylindrical ring like hollow shape and consisting of a dielectric such as quartz. The lower end of the center of the double cylindrical ring like antenna protecting cover 138 is opened to form a gas injection port 143, and the upper end is closed. The lower end of the inert gas supply tube 139 having a middle portion attached to the storing projection portion 110A through the insulating seal member 140 is connected to the upper end of the antenna protecting cover 138, and the antenna member 106 is entirely supported by the process vessel. The arrangement of the remaining parts is the same as that of the apparatus shown in FIG. 15.

In this embodiment, while an inert gas supplied into the antenna protecting cover 138 through the inert gas supply tube 139 flows downward through the central hollow portion of the antenna member 106, the inert gas is exited by a radio wave from the antenna member 106 to generate a plasma. When the plasma flows from the gas injection port 143 at the lower end, the plasma is in contact with the process gas to activate the process gas, thereby forming active species. In this case, the plasma is generated at a considerably low pressure falling within the range of $1\times10^{-3}$ Torr to $1\times10^{-6}$ Torr, and an etching process can be performed with a high anisotropy to obtain a sharp shape. In addition, the plasma can be efficiently generated, and the same functional effect as that of the embodiment shown in FIG. 15 can be obtained.

Figure 18:
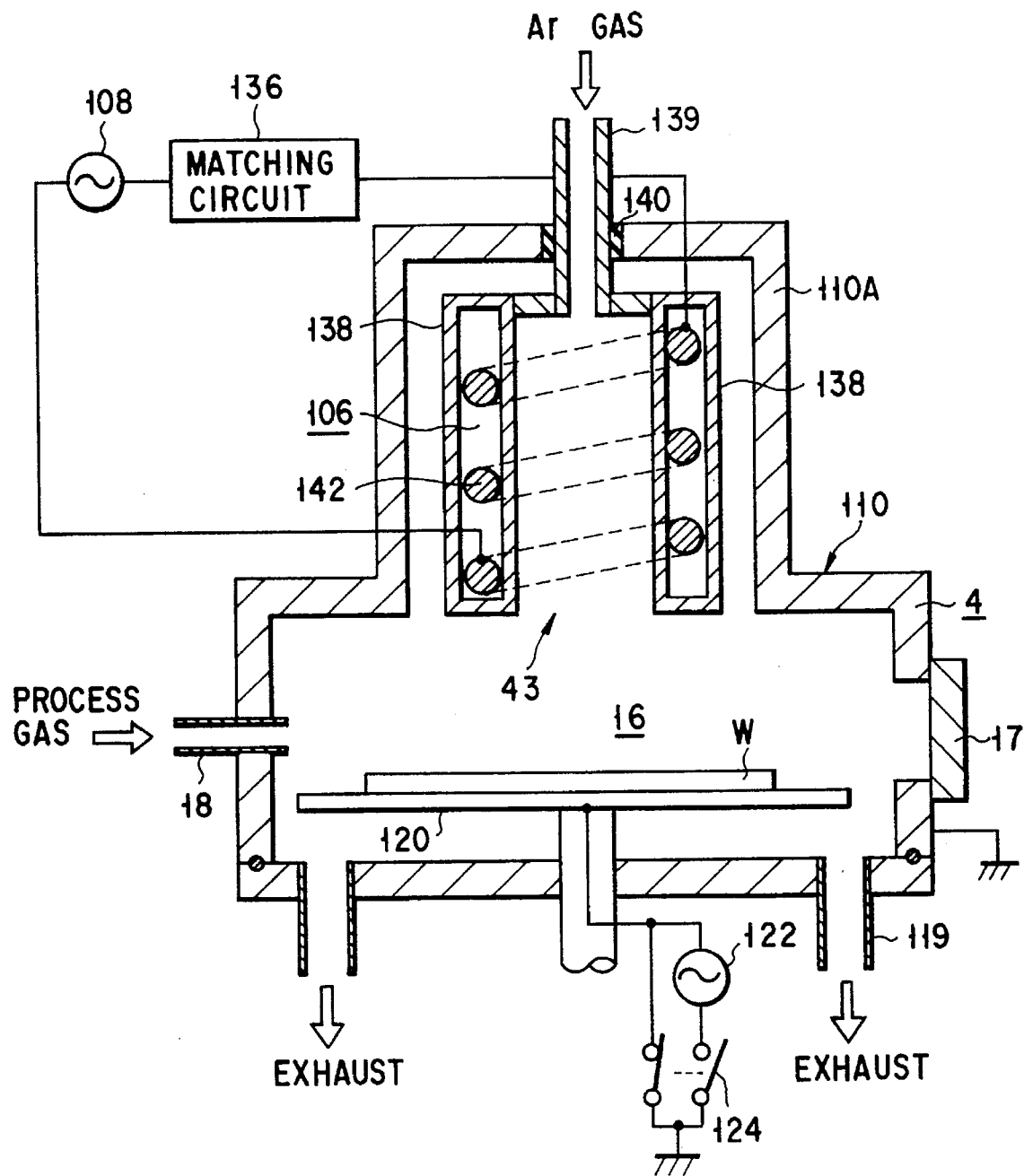
FIG. 18 is a sectional view showing a plasma processing apparatus according to still another embodiment of the present invention.

The embodiments shown in FIGS. 15 and 18 respectively explain a case wherein a planar antenna member is independently arranged and a case wherein a cylindrical coiled antenna member is independently arranged. As shown in FIG. 19, the planar antenna member and the cylindrical coiled antenna member may be combined to each other.

In this embodiment, a planer antenna portion 132 as shown in FIG. 15 is arranged on the upper end portion of the coiled antenna portion 142 as shown in FIG. 18 to constitute an antenna member 106, and the antenna member 106 is entirely covered with an antenna protecting cover 138 consisting of quarts like that shown in FIG. 18. Both the ends of the planer antenna portion 132 are connected to the RF power supply 108A through a matching circuit 136a, and both the ends of the coiled antenna portion 142 are connected to the RF power supply 108B through a matching circuit 136B.

In this case, the RF power supplies 108A and 108B respectively have frequencies which can be arbitrarily set within the range of 1 MHz to 200 MHz, e.g., as a combination of 2 MHz and 13.56 MHz or a combination of 50 MHz and 13.56 MHz. The planer antenna member 106 and the coiled antenna member 142 may be connected in series with each other, and one RF power for generating a plasma may be applied to the circuit.

In this manner, when the planer antenna member 106 and the cylindrical coil portion 142 are combined to each other, the same functional effect as in the first and second embodiments can be obtained.

In particular, when the planar antenna member 106 is independently used to perform a CVD process at an etching rate as shown in FIG. 20, a processing rate curve 144 as of a CVD film formation rate is slightly low at the center of the wafer, has a peak at the edge portion of the wafer, and gradually decreases toward the edge portion of the wafer. For this reason, an exactly uniform curve is not obtained. Therefore, when the antenna member constituted by the cylindrical coil member 142 is combined to the antenna member 106 as an auxiliary antenna member, a decrease in rate at the edge portion of the wafer is corrected, and the processing rate curve 144 is set in an almost linear state indicated by a chain line in FIG. 20. The in-plane uniformity of a process, e.g., an etching process, can be more preferably achieved.

In the apparatus described above, the antenna member is formed, and the antenna member is entirely stored in and covered with the vessel-like antenna protecting cover 138. However, the apparatus is not limited to this arrangement. For example, as shown in FIGS. 21 to 24, a conductive wire itself constituting the antenna member may have a surface directly coated with a protecting layer 146 consisting of a dielectric such as quartz and having a predetermined thickness, thereby obtaining an antenna protecting cover.

The positions of the antenna members 106 shown in FIGS. 21, 23, and 24 correspond to the antenna members shown in FIGS. 15, 18, and 19, respectively. FIG. 22 is an enlarged sectional view showing part of the apparatus in FIG. 21. An antenna member 106 having a surface coated with a protecting layer 146 having a thickness of, e.g., about several mm is supported and suspended by a support member 148 from the lower surface of a ceiling portion 110 of a process vessel 104. The thickness of the protecting layer 146 is set to be a thickness large enough to prevent heavy metal contamination caused by sputtering as described above. The protecting layer 146 can be formed such that an antenna strand is dipped in, e.g., a silicon oxide solution to grow a crystal.

In each of the apparatuses shown in FIGS. 23 and 24, when an inert gas supplied from an inert gas supply tube 139 arranged at the center of a ceiling portion 110 flows downward in the antenna storing projection portion 110A, a circular plasma guide cylinder 150 consisting of, e.g., quartz is connected to the lower end of the inert gas supply tube 139 to prevent the uneven portion of the coil portion 142 from causing turbulence. As in the cases shown in FIGS. 18 and 19, a uniformed plasma flows downward, into a process chamber 116, from a gas injection port 143 arranged at the lower end of the plasma guide cylinder 150.

In the embodiments described above, an inert gas from the inert gas supply tube 139 is directly supplied into a process vessel. However, the present invention is not limited to these embodiments. For example, as shown in FIG. 25 or 26, a known shower head 152 consisting of, e.g., quartz, may be arranged at the distal end of an inert gas supply tube 139. The shower head 152 has a straightening plate 156 or a plurality of straightening plates 156 arranged parallel to each other with predetermined intervals, thereby uniforming supplying an inert gas over the entire area in a wafer plane.

In the embodiment shown in FIG. 25, the shower head 152 supported by a ceiling portion 110 is arranged between the lower surface of the ceiling portion 110 of a process vessel 104 and a 1-turn antenna member 106 having a surface directly coated with a protecting layer 146 as shown in FIG. 21.

In the embodiment shown in FIG. 26, an antenna member 106 stored in an antenna protecting cover 138 is arranged below the lower surface of a ceiling portion 110 as in the case shown in FIG. 15, and a shower head 152 is supported and arranged on the lower surface of the antenna member 106.

In each of the apparatuses shown in FIGS. 25 and 26, the same functional effect as described in each of the embodiments described above can be obtained. In particular, when the shower head 152 is used, an inert gas can be supplied over the entire area in a wafer plane, and the in-plane uniformity of plasma processing can be further improved.

In each of the embodiments described above, an RF power for generating a plasma is applied to both the ends of each antenna member. However, the present invention is not limited to this. An RF power may be applied to one end of each antenna member, and the other end may be used as an open end.

The number of turns of the antenna member is not limited to the number of turns defined in each of the above embodiments, as a matter of course. The number of turns may be increased as needed.

In each of the above embodiments, an etching process using a plasma has been mainly explained. However, the present invention is not limited to these embodiments, and the present invention can be applied to other processes such as a plasma CVD process and a plasma etching process, as a matter of course.

A semiconductor wafer has been explained as an object to be processed. However, the present invention can be applied to not only the semiconductor wafer but also a substrate such as an LCD substrate.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A plasma processing apparatus comprising:

a process vessel having a circumferential wall and an evacuated interior;

means for supporting a target object to be processed having a target surface to be processed in said process vessel;

process gas supply means for supplying a process gas for the target object into said process vessel; and means for generating an electromagnetic wave in said process vessel to generate a plasma of the process gas;

said process gas supply means comprising a plurality of process gas injection holes formed at a plurality of levels in a direction substantially perpendicular to the target surface of the target object in said process vessel, and one or more gas injection holes, of the gas injection holes, located at an upper level is closer to a center of the target surface than one or more gas injection holes, of the gas injection holes, located at a lower level.

2. An apparatus according to claim 1, wherein said process gas supply means has a plurality of supply nozzles arranged at a plurality of levels in said process vessel and respectively having the process gas injection holes, and supply nozzles at each level are radially arranged about a central axis passing through the center of the target surface perpendicularly to the target surface.

3. An apparatus according to claim 2, wherein each of said supply nozzles extends from the circumferential surface of said process vessel to be parallel to the target surface of the target object and has a corresponding one of the process gas injection holes formed in an extended end of said each nozzle, and a nozzle at an upper level is longer than a nozzle at a lower level.

4. An apparatus according to claim 3, wherein each of the levels has the same number of supply nozzles.

5. An apparatus according to claim 4, further comprising means for simultaneously injecting a process gas from said supply nozzles at equal flow rates.

6. An apparatus according to claim 1, wherein the process gas injection hole located at the lower level is located between the circumferential wall of said process vessel and an edge of the target object.

7. An apparatus according to claim 1, further comprising additive gas supply means for supplying an additive gas into said process vessel, said additive gas supply means having an additive gas injection hole formed to be farther away from the target object than the process gas injection hole at the upper level in a direction substantially perpendicular to the target surface of the target object.

8. An apparatus according to claim 7, wherein said process gas supply means has means for supplying a film formation gas, and said additive gas supply means has means for supplying an inert gas, an oxygen gas, or a gas mixture thereof.

9. An apparatus according to claim 1, wherein said process gas supply means has a gas supply head arranged in said process vessel and having a gas injection surface opposing the target object at an interval, and said process gas injection holes are formed at a plurality levels in the gas injection surface.

10. An apparatus according to claim 9, wherein said gas supply head consists of quartz and is deformed such that the gas injection surface has a center closer to the target surface of the target object than an edge of the gas injection surface.

11. An apparatus according to claim 10, wherein the gas injection surface has a curved surface.

12. An apparatus according to claim 10, wherein the gas injection surface has an inclined surface.

13. A plasma processing apparatus comprising:

a process vessel having a circumferential wall, a ceiling portion, and an interior evacuated at $10^{-2}$ to $10^{-6}$ Torr;

a susceptor, arranged in said process vessel, for supporting a target object to be processed on an upper surface of said susceptor such that a target surface to be processed faces upward;

an electromagnetic wave generating antenna member arranged to oppose the target surface of the target object supported by said susceptor at an interval;

an RF power supply connected to said antenna member;

supply means for supplying a process gas into said process vessel; and process gas injection holes formed in said supply means above said susceptor at a plurality of levels in a vertical direction, one or more gas injection holes, of the gas injection holes, located at an upper level arranged closer to a center of said process vessel than one or more gas injection holes, of the gas injection holes, located at a lower level.

14. An apparatus according to claim 13, wherein said antenna member is arranged in said process vessel, and further comprising protecting means for protecting said antenna member from the process gas.

* * * * *